United States Patent
Yang et al.

(10) Patent No.: US 10,505,152 B2
(45) Date of Patent: Dec. 10, 2019

(54) QUANTUM ROD, METHOD OF MANUFACTURING QUANTUM ROD AND DISPLAY PANEL

(71) Applicant: Boe Technology Group Co., Ltd., Beijing (CN)

(72) Inventors: Jiuxia Yang, Beijing (CN); Feng Bai, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 136 days.

(21) Appl. No.: 15/329,352

(22) PCT Filed: May 18, 2016

(86) PCT No.: PCT/CN2016/082429
§ 371 (c)(1),
(2) Date: Jan. 26, 2017

(87) PCT Pub. No.: WO2017/133130
PCT Pub. Date: Aug. 10, 2017

(65) Prior Publication Data
US 2018/0212202 A1      Jul. 26, 2018

(30) Foreign Application Priority Data
Feb. 1, 2016   (CN) .......................... 2016 1 0068988

(51) Int. Cl.
*H01L 51/52*   (2006.01)
*H01L 33/00*   (2010.01)
(Continued)

(52) U.S. Cl.
CPC .......... *H01L 51/5293* (2013.01); *C09K 11/02* (2013.01); *C09K 11/883* (2013.01);
(Continued)

(58) Field of Classification Search
None
See application file for complete search history.

(56) References Cited

U.S. PATENT DOCUMENTS 8,350,251 B1 * 1/2013 Lowgren ................. H01L 33/06
257/13
2008/0230764 A1   9/2008 Burt
(Continued)

FOREIGN PATENT DOCUMENTS

| CN | 1922736 A   | 2/2007 |
| CN | 101343540 A | 1/2009 |

(Continued)

OTHER PUBLICATIONS

International Search Report for PCT/CN2016/082429 dated Oct. 28, 2016.
(Continued)

*Primary Examiner* — Shaun M Campbell
(74) *Attorney, Agent, or Firm* — Calfee, Halter & Griswold LLP (57) ABSTRACT

The present disclosure provides a quantum rod, a method of manufacturing a quantum rod and a display panel, wherein the quantum rod comprises a core and a shell covering the core, and the core and/or the shell is further covered with a conductive material layer.

19 Claims, 3 Drawing Sheets

(51) Int. Cl.
*H01L 33/06* (2010.01)
*H01L 51/50* (2006.01)
*H01L 51/56* (2006.01)
*C09K 11/88* (2006.01)
*H01L 51/00* (2006.01)
*C09K 11/02* (2006.01)
*H01L 33/28* (2010.01)

(52) U.S. Cl.
CPC .......... *H01L 33/0083* (2013.01); *H01L 33/06* (2013.01); *H01L 51/0037* (2013.01); *H01L 51/502* (2013.01); *H01L 51/5036* (2013.01); *H01L 51/56* (2013.01); *H01L 33/28* (2013.01)

(56) References Cited

U.S. PATENT DOCUMENTS

| | | | |
|---|---|---|---|
| 2013/0056244 A1* | 3/2013 | Srinivas | G06F 3/041 174/250 |
| 2013/0151568 A1 | 6/2013 | Ellison et al. | |
| 2015/0146452 A1* | 5/2015 | Kim | F21V 9/14 362/611 |
| 2016/0216545 A1* | 7/2016 | Lee | G02F 1/133377 |
| 2017/0255051 A1 | 9/2017 | Liu | |

FOREIGN PATENT DOCUMENTS

| | | |
|---|---|---|
| CN | 103091892 | 5/2013 |
| CN | 103840052 | 6/2014 |
| CN | 104040642 A | 9/2014 |
| CN | 104680942 A | 6/2015 |
| CN | 105061732 A | 11/2015 |
| CN | 105068330 A | 11/2015 |
| CN | 105093677 | 11/2015 |
| CN | 105511150 | 4/2016 |
| KR | 20140021735 | 2/2014 |
| WO | 2016002434 | 1/2016 |

OTHER PUBLICATIONS

Weiwei, Wang, "Applications of Room-Temperature Ionic Liquids in the Preparation of Nanomaterials," World Sci-Tech R&D. vol. 30, No. 4, Aug. 2008, pp. 391-395.

First Office Action for Chinese Patent Application No. 201610068988.4 dated Feb. 28, 2018.

* cited by examiner

```
┌─────────────────────────────────────────────────────┐
│                                                     │
│     cleaning the upper substrate and the lower      │
│                     substrate                       │
│                                                     │
└─────────────────────────────────────────────────────┘
                          │
┌─────────────────────────────────────────────────────┐
│                                                     │
│  forming an alignment layer on the upper substrate  │
│              and the lower substrate                │
│                                                     │
└─────────────────────────────────────────────────────┘
                          │
┌─────────────────────────────────────────────────────┐
│                                                     │
│  injecting a quantum rod between the alignment      │
│  layers formed on the upper substrate and the       │
│                  lower substrate                    │
│                                                     │
└─────────────────────────────────────────────────────┘
                          │
┌─────────────────────────────────────────────────────┐
│                                                     │
│     performing cell alignment between the upper     │
│            substrate and the lower substrate        │
│                                                     │
└─────────────────────────────────────────────────────┘
```

Fig.5

QUANTUM ROD, METHOD OF MANUFACTURING QUANTUM ROD AND DISPLAY PANEL

RELATED APPLICATIONS

The present application is the U.S. national phase entry of PCT/CN2016/082429, with an international filing date of May 18, 2016, which claims the benefit of Chinese Patent Applications No. 201610068988.4, filed on Feb. 1, 2016, the entire disclosures of which are incorporated herein by reference.

FIELD

The present disclosure relates to a quantum rod, a method of manufacturing a quantum rod and a display panel, which pertains to the field of display device manufacturing technologies.

BACKGROUND

Existing color display is generally achieved by a white light source plus a color filter. Taking a liquid crystal display device as an example, it comprises a backlight and a display panel, wherein the backlight emits white light. The liquid crystal display panel comprises an array substrate, a color film substrate and a liquid crystal located between the array substrate and the color film substrate. The surfaces of the array substrate and the color film substrate which face the liquid crystal are provided with a lower polarizer and an upper polarizer respectively, so as to polarize and analyze the light emitted by the backlight. A color filter film layer is formed on the color film substrate. The color film layer typically comprises a red (R) film layer, a green (G) film layer and a blue (B) film layer. The white light emitted by the backlight, after passing through a color film layer, only displays light of the color of the corresponding film layer. Based on the example that one pixel on the display panel includes three subpixels, the three subpixels in one pixel display three primary colors of red, green and blue respectively, thereby achieving color display. This color display method, due to the addition of a color filter, leads to low light transmittance, low backlight utilization rate, and poor display effect.

SUMMARY

The quantum rod material is a crystalline material having a diameter of several nanometers and a length in the range of 10 to 100 nm. Like the quantum dot, a quantum rod has the same absorption characteristic and luminescent property, that is, it emits light under the excitation of a specific excitation source. Moreover, the wavelength of the emitted light can be controlled and adjusted by adjusting the size and category of the quantum rod. The emission wavelength of the quantum rod is adjustable and may cover the whole visible light range.

The quantum rod has an elongated form such that it has optical properties the quantum dot does not have. For example, the most special optical property of the quantum rod is that it has the property of emitting polarized light and is capable of emitting polarized light parallel to its major axis and perpendicular to its minor axis. This luminescent property of the quantum rod allows polarized light in the direction of the major axes of the quantum rods arranged along a predefined axial direction to be obtained therefrom.

Since the orientation of the quantum rod varies with the magnitude of a voltage applied thereto, the polarization direction of the light emitted by the quantum rod can be controlled by controlling the voltage applied to the quantum rod. Therefore, the quantum rod can replace the liquid crystal in the liquid crystal display panel, and further functions as a lower polarizer in the liquid crystal display panel. By appropriately selecting the composition of the quantum rod, the quantum rod can produce polychromatic light (such as red, green and blue) upon excitation, so that a color filter is no longer required. Since a color filter is no longer required, the light transmittance of the display panel using the quantum rod is enhanced and the display effect is improved.

The driving voltage for an existing quantum rod is high, which is disadvantageous to energy saving, and such problem of the quantum rod is particularly conspicuous when used in a portable display device having limited electric power.

To this end, the present disclosure provides a quantum rod, a method of manufacturing a quantum rod, and a display panel.

In one aspect, the present disclosure provides a quantum rod comprising a core and a shell, the shell covering the core. The core and/or the shell are further covered with a conductive material layer.

In some embodiments, the conductive material is a conductive polymer material.

In some embodiments, the conductive polymer material is any one or more of poly(3,4-ethylenedioxythiophene)-poly (styrene sulfonic acid) PEDOT PSS, poly-phenylene vinylene PPV, polythiophene, polysilane, triphenylmethane, triarylamine, pyrazoline polyacetylene, polypyrrole, polyaniline, polyhenylene, poly(phenylene ethynylene) and polydiacetylene.

In some embodiments, the core and/or the shell comprise CaS, CaSe.

In another aspect, the present disclosure provides a method of manufacturing a quantum rod, comprising: manufacturing a nanocrystalline reaction chamber on a mother set; forming, in the nanocrystalline reaction chamber, a core of a nanocrystalline quantum rod and a shell thereof covered with a conductive material layer.

In some embodiments, said forming, in the nanocrystalline reaction chamber, a shell of a nanocrystalline quantum rod covered with a conductive material layer comprises: a step of performing surface treatment on the shell of the nanocrystalline quantum rod during a reaction such that the shell of the nanocrystalline quantum rod is covered with a conductive material layer.

In some embodiments, the step of forming, in the nanocrystalline reaction chamber, a core of a nanocrystalline quantum rod and a shell thereof covered with a conductive material layer is performed under vacuum.

In some embodiments, the core of the nanocrystalline quantum rod is covered with a conductive material layer.

In some embodiments, the reaction for forming the core of the nanocrystalline quantum rod covered with a conductive material layer and the shell of the nanocrystalline quantum rod covered with a conductive material layer is performed at a temperature lower than 200° C.

In some embodiments, the step of forming, in the nanocrystalline reaction chamber, a core of a nanocrystalline quantum rod covered with a conductive material layer and a shell thereof covered with a conductive material layer comprises: mixing a conductive polymer material with an ionic liquid to form a conductive polymer solution; mixing a quantum rod material with the conductive polymer solution; stirring and dispersing a mixture of the quantum rod material and the conductive polymer solution to form a core of a nanocrystalline quantum rod covered with a conductive material layer and a shell of a nanocrystalline quantum rod covered with a conductive material layer.

In some embodiments, the ionic liquid is at least one of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate and 1-butyl-3-methylimidazolium chloride.

In some embodiments, a mixing ratio of the conductive polymer material to the ionic liquid is greater than or equal to 1:9.

In some embodiments, the mixture of the quantum rod material and the conductive polymer solution has a solid content of less than or equal to 15%.

In some embodiments, a condition of the dispersing is performing stirring and dispersion at a linear velocity of 2.5 m/s for 10 minutes.

In some embodiments, pre-stirring and dispersion is further comprised prior to the dispersing.

In some embodiments, the pre-stirring and dispersion is performed under a condition of: performing stirring at a speed of less than or equal to 100 rpm for 10 to 30 min.

In some embodiments, the step of forming, in the nanocrystalline reaction chamber, a core of a nanocrystalline quantum rod covered with a conductive material layer and a shell thereof covered with a conductive material layer is performed under vacuum.

In a further aspect, the present disclosure further provides a display panel, comprising: an upper substrate and a lower substrate, the quantum rod described above arranged between the upper substrate and the lower substrate.

In some embodiments, the surface of the upper substrate facing the quantum rod is provided with an alignment layer. The surface of the lower substrate facing the quantum rod may or may not comprise an alignment layer. When the lower substrate comprises an alignment layer, the alignment layers of the upper and lower substrates act as a polarizer and an analyzer respectively. When the lower substrate does not comprise an alignment layer, the quantum rod's property of emitting polarized light enables the quantum rod itself to act as a polarizer, while the alignment layer of the upper substrate acts as an analyzer. Since only one alignment layer is used, the cost of the display panel is reduced.

In some embodiments, the upper substrate is a color film substrate, and the quantum rod is excited to emit white light. In this case, the white light emitted by the quantum rod cooperates with the color film of the color film substrate to thereby emit light of multiple colors.

In some embodiments, the quantum rod is excited to emit light of multiple colors. In this case, the display panel does not need to comprise a color film, thereby increasing the brightness of the display panel and improving the display effect.

As for the quantum rod, the method of manufacturing a quantum rod, the display panel and the manufacturing method thereof as provided by the present disclosure, by performing conductivity-enhancing surface treatment on the quantum rod during the resynthesis of the quantum rod or after the synthesis thereof, the conductivity of the quantum rod is enhanced by 180%, which significantly decreases the driving voltage of the quantum rod and reduces the power consumption, such that the display panel comprising the quantum rod is more suitable for a mobile display application.

BRIEF DESCRIPTION OF DRAWINGS

To illustrate embodiments of the present disclosure or technical solutions in the prior art more clearly, the drawings required for describing the embodiments or the prior art are simply introduced below. Apparently, the drawings described below are some embodiments of the present disclosure. For those ordinarily skilled in the art, other drawings can be further obtained based on these drawings without spending inventive efforts.

DETAILED DESCRIPTION

The implementation of the present disclosure will be further described below in detail with reference to the drawings and embodiments. The embodiments below are intended to illustrate the present disclosure, rather than to limit the scope of the present disclosure.

Figure 1:
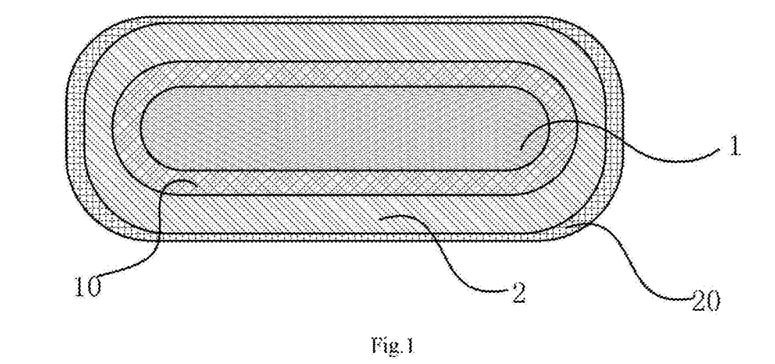
FIG. 1 is a structural schematic diagram of a quantum rod in an embodiment of the present disclosure.
Figure 2:
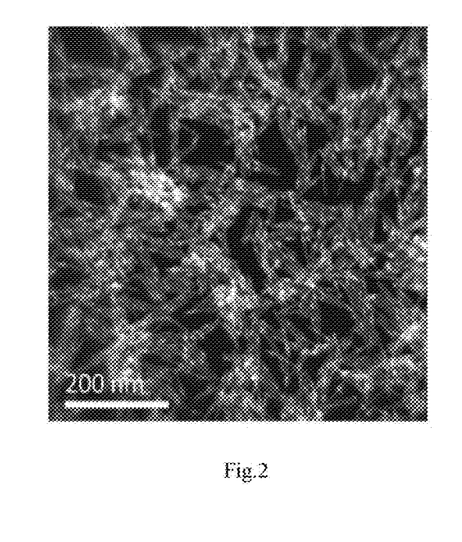
FIG. 2 is a schematic diagram showing the morphology of a quantum rod in an embodiment of the present disclosure under a scanning electron microscope.

As shown in FIGS. 1 and 2, the present disclosure provides a quantum rod comprising a core 1 and a shell 2 covering the core 1, wherein the core 1 and/or the shell 2 is further covered with a conductive material layer 10, 20. In the present disclosure, the conductive material may be selected as a conductive polymer material in order to further enhance the conductivity of the quantum rod and effectively decrease the driving voltage for the quantum rod. The conductive polymer material includes one or more of poly(3,4-ethylenedioxythiophene)-poly(styrene sulfonic acid) PEDOT PSS, poly-phenylene vinylene PPV, polythiophene, polysilane, triphenylmethane, triarylamine, pyrazoline polyacetylene, polypyrrole, polyaniline, polyhenylene, poly(phenylene ethynylene) and polydiacetylene. In the present disclosure, CaS, CaSe can be used for the core and/or the shell of the quantum rod. In the present disclosure, both the core and the shell of the quantum rod may be covered with the conductive material. Of course, it is to be understood that the present disclosure is not limited thereto. The core of the quantum rod may be individually covered with the conductive material, or the shell of the quantum rod may be individually covered with the conductive material. In short, the concept of the present disclosure can be achieved regardless of whether both the core and the shell of the quantum rod are covered with the conductive material, or either of the core and the shell of the quantum rod is covered with the conductive material.

Figure 3:
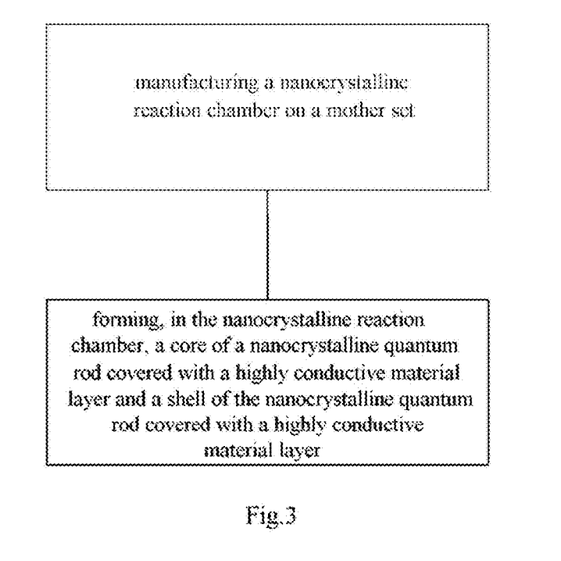
FIG. 3 is a schematic diagram showing a flow chart of a method of manufacturing a quantum rod in an embodiment of the present disclosure.
Figure 4:
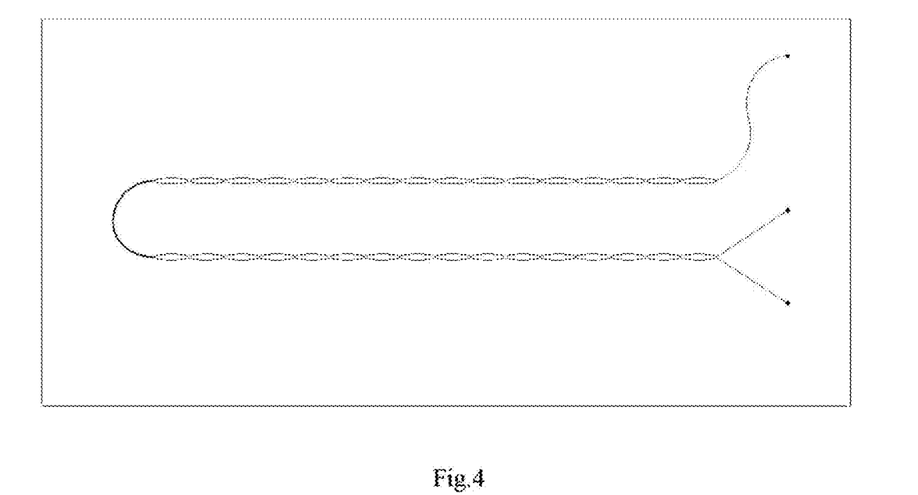
FIG. 4 is a structural schematic diagram of a nanocrystalline reaction chamber in an embodiment of the present disclosure.

As shown in FIG. 3, there is provided a method of manufacturing the above quantum rod. The method comprises: manufacturing a nanocrystalline reaction chamber on a mother set; forming, in the nanocrystalline reaction chamber, a core of a nanocrystalline quantum rod covered with a conductive material layer and a shell of a nanocrystalline quantum rod covered with a conductive material layer. By covering the quantum rod with the conductive material, the conductivity of the quantum rod can be enhanced and the driving voltage for the quantum rod can be effectively decreased. Specifically, as shown in FIG. 4, the nanocrystalline reaction chamber of the present disclosure is configured to synthesize quantum rod crystals, and the nanocrystalline reaction chamber of the present disclosure can achieve uniformity and evenness of nanocrystalline quantum rods by temperature control. In the present disclosure, in order to effectively decrease the driving voltage for the quantum rod and enhance the transmittance, when the quantum rod is being manufactured, the reaction for forming a core of the nanocrystalline quantum rod covered with a conductive material layer and a shell of the nanocrystalline quantum rod covered with a conductive material layer may be performed at a temperature lower than 200° C. In the present disclosure, when the quantum rod is being manufactured, surface treatment is also performed on the nanocrystalline quantum rod during the reaction.

In the present disclosure, the surface treatment on the quantum rod comprises mixing the conductive polymer material with an ionic liquid to form a conductive polymer solution; mixing a quantum rod material with the conductive polymer solution; dispersing a mixture of the quantum rod material and the conductive polymer solution to form a core of the nanocrystalline quantum rod covered with a conductive material layer and a shell thereof covered with a conductive material layer. The dispersion can be performed by using ultrasonic waves, or by stirring, or by mechanical agitation. The dispersion treatment can prevent occurrence of agglomeration of the ionic liquids during the reaction.

When the conductive polymer material is mixed with the ionic liquid to form a conductive polymer solution, a mixing ratio of the conductive polymer material to the ionic liquid may be greater than or equal to 1:9. In the present disclosure, the ionic liquid is at least one of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate and 1-butyl-3-methylimidazolium chloride.

When the quantum rod material is mixed with the conductive polymer solution, the mixture of the quantum rod material and the conductive polymer solution may have a solid content of less than or equal to 15%.

Dispersing a mixture of the quantum rod material and the conductive polymer solution comprises pre-dispersion and dispersion at a stirring speed of less than or equal to 100 rpm for 10 to 30 min, which is performed under a condition of stirring at a linear velocity of 2.5 m/s for 10 min.

Since the quantum rod material is sensitive to water, gas and temperature, manufacturing the quantum rod is performed in a vacuum environment, and requires an environmental condition at a degree of cleanliness of class 100.

The present disclosure further provides a method of manufacturing a quantum rod, comprising: manufacturing a nanocrystalline reaction chamber on a mother set; forming, in the nanocrystalline reaction chamber, a core of a nanocrystalline quantum rod and a shell thereof covered with a conductive material layer. By virtue of the present disclosure, the surface of the formed quantum rod can be covered with a conductive material to enhance the conductivity of the quantum rod and decrease the driving voltage for the quantum rod. Said forming, in the nanocrystalline reaction chamber, a shell of the nanocrystalline quantum rod covered with a conductive material layer further comprises a step of performing surface treatment on the shell of the nanocrystalline quantum rod during the reaction, such that the shell of the nanocrystalline quantum rod is covered with a conductive material layer. The present disclosure is not limited only to the above method, which can be achieved by any method that enables the shell of the quantum rod to be covered with a conductive material. For example, the quantum rod is mixed with a conductive polymer material, and then the surface of the quantum rod is further formed with a conductive material layer. Since the quantum rod material is sensitive to water, gas and temperature, the step of forming, in the nanocrystalline reaction chamber, a core of a nanocrystalline quantum rod and a shell thereof covered with a conductive material layer is carried out under vacuum, and requires an environmental condition at a degree of cleanliness of class 100.

The present disclosure further provides a display panel. The display panel comprises an upper substrate and a lower substrate between which the above quantum rod is disposed. The surface of the upper substrate facing the quantum rod is provided with an alignment layer. The surface of the lower substrate facing the quantum rod may or may not comprise an alignment layer. When the lower substrate comprises an alignment layer, the alignment layers of the upper and lower substrates act as a polarizer and an analyzer respectively. When the lower substrate does not comprise an alignment layer, the quantum rod's property of emitting polarized light enables the quantum rod itself to act as a polarizer, while the alignment layer of the upper substrate acts as an analyzer. Since only one alignment layer is used, the cost of the display panel is reduced.

In the quantum rod display panel of the present disclosure, when the upper substrate is designed as a color film substrate, the quantum rods designed between the upper substrate and the lower substrate are composed of quantum rods of different specifications, and emit white light under the excitation of an electric field, which light is combined with the color film of the upper substrate to form color display.

Alternatively, in the quantum rod display panel of the present disclosure, when the upper substrate is designed as a non-color film substrate (e.g. a glass substrate), the quantum rods designed between the upper substrate and the lower substrate include quantum rods designed in respective subpixel areas on the substrate respectively to emit light of multiple colors (e.g. red, green, blue) respectively under excitation. Under the effect of an electric field, respective subpixels emit red light, green light and blue light respectively, thereby realizing color display.

Figure 5:
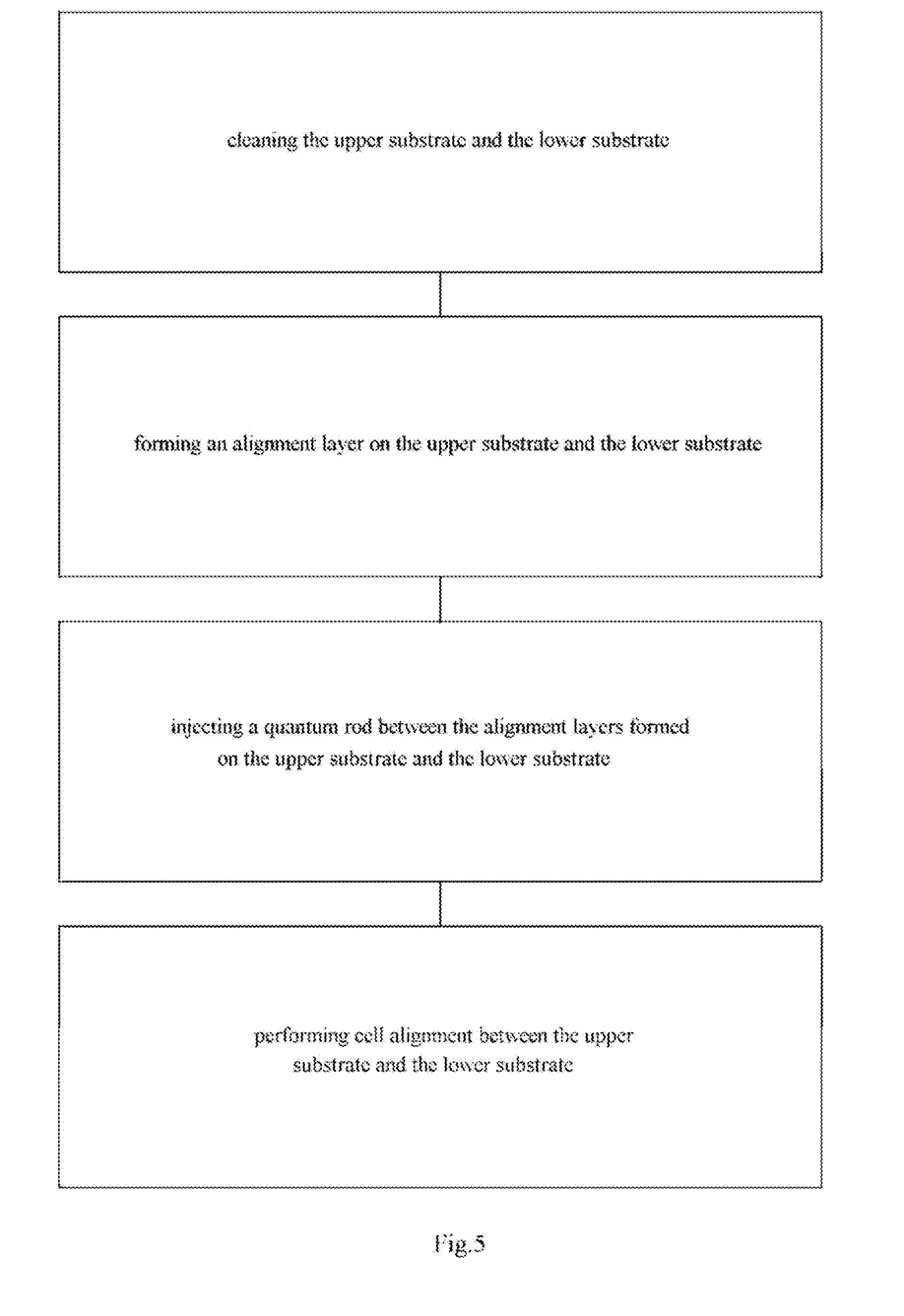
FIG. 5 is a schematic diagram showing a flowchart of a method of manufacturing a display panel in an embodiment of the present disclosure.

As shown in FIG. 5, a method of manufacturing a display panel comprises: cleaning the upper substrate and the lower substrate; forming an alignment layer on the upper substrate and the lower substrate; injecting a quantum rod between the alignment layers formed on the upper substrate and the lower substrate; performing cell alignment between the upper substrate and the lower substrate, wherein the quantum rod is the quantum rod described above. In the present disclosure, processes not mentioned may be implemented using the methods of the existing processes and will not be described here for simplicity.

To further demonstrate the superiority of the quantum rod, the method of manufacturing a quantum rod, the display panel and the manufacturing method thereof as provided by the present disclosure, the following experiment is conducted.

Experimental conditions are as follows.

The driving voltage was tested by adjusting the luminance, and an oscilloscope was used for measurement. The transmittance was measured using a 7200-model visible light spectrophotometer.

In addition to the above temperature condition, the above embodiments dissolved PEDOT PSS in ionic liquids of 1-octyl-3-methylimidazolium hexafluorophosphate ([omim] PF6) and 1-ethyl-3-methylimidazolium tetrafluoroborate ([emim] BF4), wherein the weight ratio was as follows:

PEDOT PSS:1-octyl-3-methylimidazolium hexafluorophosphate ([omim] PF6):1-ethyl-3-methylimidazolium tetrafluoroborate ([emim] BF4)=1:7:3;

CdSe was employed as the quantum rod material, and the quantum rod had a solids content of 6%;

dispersion process parameters were as follows:

pre-dispersion process parameters: speed 80 rpm, time 25 min;

dispersion process parameters: 2.5 m/S*10 min.

Experimental Results and Analysis

TABLE 1

Test Result

| | TEMP Effect | | | | | | | | | | | | | |
|---|---|---|---|---|---|---|---|---|---|---|---|---|---|---|
| | 150° C. | | 180° C. | | 200° C. | | 210° C. | | 220° C. | | 240° C. | | 300° C. | |
| | No surface treatment | Surface treatment | No surface treatment | Surface treatment | No surface treatment | Surface treatment | No surface treatment | Surface treatment | No surface treatment | Surface treatment | No surface treatment | Surface treatment | No surface treatment | Surface treatment |
| Driving Voltage (Relative treatment Value) | 1.82 | 1 | 1.78 | 1 | 1.9 | 1 | 2.31 | 1.54 | 2.52 | 1.65 | 2.65 | 1.88 | 3.78 | 2.25 |
| Transmittance (RT) | 100 | 100 | 100 | 100 | 100 | 100 | 92 | 93 | 82 | 81 | 71 | 73 | 65 | 68 |
| Comprehensive Evaluation | good | excellent | good | excellent | good | excellent | average | average | poor | average | poor | poor | poor | poor |

Result Analysis:

Driving voltage: Since the quantum rod is electrically excited to emit light while rotating and transmitting light within the cell, it needs a relatively high driving voltage. The driving voltage can be effectively decreased by using the conductivity-enhancing surface treatment process of the present disclosure, and the results are shown in Table 1. Transmittance: During the synthesis and surface treatment of the quantum rod, strictly controlling the temperature and time can make the quantum rod uniformly grow in proportion in various directions, thus obtaining quantum rods with uniform shapes and specifications. Consequently, the rotation angle of the quantum rod within the cell can be precisely controlled under the driving of voltage, thus the transmission of light can be guaranteed. However, when the temperature exceeds the temperature set in the present disclosure, 1) the precision in control of shape uniformity of the quantum rods decreases, and the rotation angles of respective quantum rod units cannot be precisely controlled upon rotation driven by voltage, thus the amount of transmitted light cannot form a uniform surface light source; (2) due to the too high temperature, the growth of the quantum rod is too fast, which is disadvantageous to the surface treatment on the quantum rod by the conductive polymer and thereby results in differences in the surface treatment degree between different quantum rods and inconsistent conductivities, such that the rotation form and angle of each quantum rod cannot be precisely controlled under the same driving voltage. In addition, to achieve the rotation angle and the amount of transmitted light set for the quantum rod, the driving voltage needs to be raised. At that time, the driving voltage is increased, resulting in high energy consumption.

In conclusion, as for the quantum rod, the method of manufacturing a quantum rod, the display panel and the manufacturing method thereof as provided by the present disclosure, conductivity-enhancing surface treatment is performed on the quantum rod during the resynthesis of the quantum rod or after the synthesis thereof, thereby adjusting optical properties of the cell, because the quantum rod rotates when being applied with a voltage. Accordingly, in order to decrease the driving voltage for the quantum rod and reduce the power consumption, the present disclosure performs conductivity-enhancing surface treatment on the quantum rod. The conductivity of the quantum rod is enhanced by 180% by means of surface treatment, significantly reducing the driving voltage. There are two methods for surface modification of the present disclosure: 1) Conductivity-enhancing surface modification performed on the quantum rod during the synthetic reaction thereof, i.e. adding the conductive polymer solution into a reaction tank, performing embedded modification on the quantum rod synchronously with the synthetic reaction. The conductive polymer needs to be dissolved in advance prior to being added to the reaction tank, and the solid content of the conductive polymer solution is controlled as required by the present disclosure. 2) Surface modification performed on the quantum rod after the synthesis thereof. As for the surface modification after the synthesis, in addition to dissolving the conductive polymer solution in the first place, dispersion and stirring also need to be performed synchronously. Thus, it is required to control the speed, temperature, time and solid content. The quantum rod surface treatment of the present disclosure can obtain a uniformly treated quantum rod, which can decrease the driving voltage by nearly 50%.

It is to be noted that relational terms such as first and second are solely used herein to distinguish one entity or operation from another without necessarily requiring or implying any actual such relationship or order between these such entities or operations. Moreover, the terms "comprise", "include" or any other variation thereof is intended to encompass non-exclusive inclusion such that a process, method, article or device that includes a series of elements includes not only those elements but also other elements not explicitly listed, or also includes elements inherent to such process, method, article or device. Without further limitation, elements defined by the phrase "comprising one . . . " do not preclude the presence of additional identical elements in a process, method, article, or device that includes said elements. The orientations or positional relationships indicated by the terms such as "upper" and "lower" are based on orientations or positional relationships shown in the drawings, which are only for facilitating description of the present disclosure and simplifying description, rather than indicating or implying that the indicated apparatus or element must have a specific orientation, or must be constructed and operated in a particular orientation, thus they cannot be construed as limitations to the present disclosure. Unless expressly specified and defined otherwise, the terms "installation", "connected" and "connection" should be understood broadly. For example, "connection" may be fixed connection, detachable connection or integral connection; may also be mechanical connection or electrical connection; and may also be direct connection, indirect connection via an intermediate medium or communication between two elements. Those ordinarily skilled in the art may understand the specific meanings of the above terms in the present disclosure based on specific situations.

In the specification of the present disclosure, numerous specific details are set forth. It is to be understood, however, that the embodiments of the present disclosure may be practiced without these specific details. In some examples, well-known methods, structures, and techniques have not been shown in detail in order not to obscure the understanding of this specification. Similarly, it should be understood that in order to simplify the disclosure and assist in the understanding of one or more of the respective disclosed aspects, in the above description of exemplary embodiments of the present disclosure, various features of the present disclosure are sometimes grouped together into a single embodiment, graph or description thereof. However, the method of the present disclosure should not be interpreted as reflecting the intention that the claimed disclosure requires more features than those are expressly recited in each claim. Rather, as reflected by the claims, the disclosure aspects are less than all the features of the previously disclosed single embodiment. Accordingly, the claims following the detailed description are hereby expressly incorporated into the detailed description, with each claim acting as a separate embodiment of the present disclosure.

Finally, it is to be noted that the above embodiments are merely used for illustrating the technical solutions of the present disclosure rather than limiting them. Although the present disclosure has been described in detail with reference to the foregoing embodiments, those ordinarily skilled in the art should understand that the technical solutions recited in the foregoing embodiments can still be modified, or partial or all the technical features therein can be equivalently substituted. Furthermore, these modifications or substitutions do not cause the essence of the respective technical solutions to depart from the scope of the technical solutions of the embodiments of the present disclosure, all of which are encompassed within the scope of the claims and specification of the present disclosure.

The invention claimed is:

1. A quantum rod comprising
a core;
a shell covering the core; and
a conductive material layer between the core and the shell, which surrounds and directly contacts the core, and is configured to enhance conductivity of the quantum rod.

2. The quantum rod according to claim 1, wherein the conductive material is a conductive polymer material.

3. The quantum rod according to claim 2, wherein the conductive polymer material is any one or more of poly(3,4-ethylenedioxythiophene)-poly(styrene sulfonic acid) PEDOT PSS, poly-phenylene vinylene PPV, polythiophene, polysilane, triphenylmethane, triarylamine, pyrazoline polyacetylene, polypyrrole, polyaniline, polyhenylene, poly(phenylene ethynylene) and polydiacetylene.

4. The quantum rod according to claim 1, wherein at least one of the core or the shell comprises CaS or CaSe.

5. A method of manufacturing a quantum rod, comprising:
manufacturing a nanocrystalline reaction chamber;
forming, in the nanocrystalline reaction chamber, a core of a nanocrystalline quantum rod, a shell of the nanocrystalline quantum rod and a first conductive material layer between the core and the shell, which surrounds and directly contacts the core and is configured to enhance conductivity of the quantum rod.

6. The method of manufacturing a quantum rod according to claim 5, wherein the step of forming, in the nanocrystalline reaction chamber, a shell of the nanocrystalline quantum rod surrounded and directly contacted by a conductive material layer which is configured to enhance conductivity of the quantum rod further comprises:
performing surface treatment on the shell of the nanocrystalline quantum rod during a reaction such that the shell of the nanocrystalline quantum rod is surrounded and directly contacted by a second conductive material layer.

7. The method of manufacturing a quantum rod according to claim 5, wherein the step of forming, in the nanocrystalline reaction chamber, the core of a nanocrystalline quantum rod, the shell of the nanocrystalline quantum rod and a first conductive material layer between the core and the shell is performed under vacuum.

8. The method of manufacturing a quantum rod according to claim 6, wherein a reaction for forming the core of the nanocrystalline quantum rod surrounded and directly contacted by the first conductive material layer and the shell of the nanocrystalline quantum rod surrounded and directly contacted by the second conductive material layer is performed at a temperature lower than 200° C.

9. The method of manufacturing a quantum rod according to claim 6, wherein the step of forming, in the nanocrystalline reaction chamber, a core of a nanocrystalline quantum rod surrounded and directly contacted by the first conductive material layer and the shell of the nanocrystalline quantum rod surrounded and directly contacted by the second conductive material layer comprises:
mixing a conductive polymer material with an ionic liquid to form a conductive polymer solution;
mixing a quantum rod material with the conductive polymer solution;
stirring and dispersing a mixture of the quantum rod material and the conductive polymer solution to form a core of a nanocrystalline quantum rod covered with a conductive material layer and a shell of the nanocrystalline quantum rod covered with a conductive material layer.

10. The method of manufacturing a quantum rod according to claim 9, wherein the ionic liquid is at least one of 1-ethyl-3-methylimidazolium hexafluorophosphate, 1-butyl-3-methylimidazolium hexafluorophosphate, 1-octyl-3-methylimidazolium hexafluorophosphate, 1-ethyl-3-methylimidazolium tetrafluoroborate, 1-butyl-3-methylimidazolium trifluoromethanesulfonate and 1-butyl-3-methylimidazolium chloride.

11. The method of manufacturing a quantum rod according to claim 9, wherein a mixing ratio of the conductive polymer material to the ionic liquid is greater than or equal to 1:9.

12. The method of manufacturing a quantum rod according to claim 9, wherein the mixture of the quantum rod material and the conductive polymer solution has a solid content of less than or equal to 15%.

13. The method of manufacturing a quantum rod according to claim 9, wherein a condition of the dispersing is performing stirring and dispersion at a linear velocity of 2.5 m/s for 10 minutes.

14. The method of manufacturing a quantum rod according to claim 9, further comprising pre-stirring and dispersion prior to the dispersing wherein the pre-stirring and dispersion is performed under a condition of:
performing stirring at a speed of less than or equal to 100 rpm for 10 to 30 min.

15. A display panel, comprising: an upper substrate and a lower substrate between which the quantum rod according to claim 1 is provided.

16. The display panel according to claim 15, wherein a surface of the upper substrate facing the quantum rod is provided with an alignment layer.

17. The display panel according to claim 16, wherein a surface of the lower substrate facing the quantum rod is provided with an alignment layer, and the quantum rod is disposed between alignment layers of the upper and lower substrates.

18. The display panel according to claim 15, wherein the upper substrate is a color film substrate, and the quantum rod is excited to emit white light.

19. The display panel of claim 15, wherein the quantum rod is excited to emit light of multiple colors.

* * * * *